United States Patent
Lai

(10) Patent No.: US 9,484,356 B2
(45) Date of Patent: Nov. 1, 2016

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/474,399

(22) Filed: Sep. 2, 2014

(65) Prior Publication Data

US 2016/0064404 A1    Mar. 3, 2016

(51) Int. Cl.
*H01L 27/115* (2006.01)

(52) U.S. Cl.
CPC ..... *H01L 27/11582* (2013.01); *H01L 27/1157* (2013.01)

(58) Field of Classification Search
CPC ..... H01L 29/06; H01L 29/66; H01L 29/792; H01L 27/085; H01L 23/535; H01L 29/78; H01L 27/115; H01L 27/11582; H01L 27/1157; H01L 27/10; H01L 27/24; H01L 27/2436; H01L 27/088
USPC ............................ 257/314, 4, 324, 499, 368
See application file for complete search history.

(56) References Cited

U.S. PATENT DOCUMENTS

| | | | |
|---|---|---|---|
| 5,398,200 A | 3/1995 | Mazure et al. | |
| 5,554,870 A | 9/1996 | Fitch et al. | |
| 6,211,091 B1 | 4/2001 | Lien et al. | |
| 8,173,987 B2 | 5/2012 | Lung | |
| 8,372,732 B2 | 2/2013 | Kim | |
| 8,486,791 B2 | 7/2013 | Lue | |
| 8,503,213 B2 | 8/2013 | Chen et al. | |
| 8,574,992 B2 | 11/2013 | Chen et al. | |
| 8,759,899 B1 | 6/2014 | Lue et al. | |
| 8,829,646 B2 | 9/2014 | Lung et al. | |
| 2008/0094873 A1 | 4/2008 | Lai et al. | |
| 2010/0059595 A1 | 3/2010 | Longfu | |
| 2011/0280077 A1 | 11/2011 | Fishburn | |
| 2012/0100700 A1* | 4/2012 | Kim ................... | H01L 29/7926 438/478 |
| 2012/0181654 A1* | 7/2012 | Lue ................... | H01L 27/11578 257/506 |
| 2012/0205722 A1* | 8/2012 | Lee et al. ........... | H01L 27/1157 257/211 |
| 2012/0276696 A1* | 11/2012 | Yang et al. ....... | H01L 27/11556 438/156 |

(Continued)

FOREIGN PATENT DOCUMENTS

TW     411574 B     11/2000

OTHER PUBLICATIONS

Non-Final Office Action issued by USPTO for U.S. Appl. No. 13/652,701, filed Oct. 16, 2012, mailed Sep. 24, 2014.

(Continued)

*Primary Examiner* — Chuong A Luu
(74) *Attorney, Agent, or Firm* — McClure, Qualey & Rodack, LLP

(57) ABSTRACT

A semiconductor structure and a method for manufacturing the same are provided. The semiconductor structure comprises a substrate, a stack of alternate conductive layers and insulating layers, an opening, an oxide layer and a conductor. The stack is formed on the substrate. The opening penetrates through the stack. The oxide layer is formed on a sidewall of the opening. The conductor is filled into the opening. The conductor is separated from the sidewall of the opening by only the oxide layer.

7 Claims, 19 Drawing Sheets

(56) References Cited

U.S. PATENT DOCUMENTS

| | | |
|---|---|---|
| 2013/0043509 A1 | 2/2013 | Cho et al. |
| 2013/0075802 A1* | 3/2013 | Chen et al. ....... H01L 27/11206 257/314 |
| 2013/0127011 A1 | 5/2013 | Higashitani et al. |
| 2013/0164922 A1 | 6/2013 | Cho et al. |
| 2013/0229846 A1 | 9/2013 | Chien et al. |
| 2013/0328005 A1 | 12/2013 | Shin et al. |
| 2014/0103530 A1 | 4/2014 | Lai et al. |
| 2014/0151627 A1 | 6/2014 | Hong et al. |
| 2014/0151774 A1* | 6/2014 | Rhie ................. H01L 27/11573 257/314 |
| 2014/0166963 A1 | 6/2014 | Lee |
| 2014/0246716 A1 | 9/2014 | Sinha |
| 2015/0084204 A1 | 3/2015 | Yun et al. |

OTHER PUBLICATIONS

Non-Final Office Action issued by USPTO for U.S. Appl. No. 14/143,040, filed Dec. 30, 2013, mailed Apr. 3, 2015.

Final Office Action issued by USPTO for U.S. Appl. No. 13/652,701, filed Oct. 16, 2012, mailed Feb. 17, 2015.

TIPO Office Action dated Jun. 23, 2016 in Taiwan application (No. 103127430).

* cited by examiner

SEMICONDUCTOR STRUCTURE AND METHOD FOR MANUFACTURING THE SAME

BACKGROUND

1. Technical Field

The disclosure relates to a semiconductor structure and a method for manufacturing the same. More particularly, the disclosure relates to a three-dimensional (3-D) memory semiconductor structure and a method for manufacturing the same.

2. Description of the Related Art

Semiconductor devices have become denser and smaller. 3-D memories, going with the trend, have been developed.

In a typical 3-D memory semiconductor structure, the gate oxide for the string select structure and the ground select structure is an oxide-nitride-oxide (ONO) multilayer or an oxide-nitride-oxide-nitride-oxide (ONONO) multilayer, which is also used in the memory cells. As such, during the program/erase of the memory cells, the gate oxide for the string select structure and the ground select structure may also be charged. Thus, an extra circuitry is needed to control program/erase of the gate oxide for the string select structure and the ground select structure. Further, since the ONO multilayer or the ONONO multilayer is thick, it is somewhat difficult to control a NAND string channel.

Besides, in a typical 3-D memory semiconductor structure, bit line pad resistance may be large. As such, a layer-by-layer implantation process is needed. However, this process is expensive, and the process window thereof is narrow.

SUMMARY

In this disclosure, a semiconductor structure and a method for manufacturing the same are provided to solve at least some of the problems described above.

According to some embodiment, the semiconductor structure comprises a substrate, a stack of alternate conductive layers and insulating layers, two openings, an oxide layer and a conductor. The stack is formed on the substrate. The two openings penetrate through the stack. The oxide layer is formed on sidewalls of the two openings. The conductor is filled into the two openings. The conductor is separated from the sidewalls of the openings by only the oxide layer.

According to some embodiment, the semiconductor structure comprises a substrate, a stack of alternate conductive layers and insulating layers, an opening, an oxide layer and a conductor. The stack is formed on the substrate. The opening penetrates through the stack. The oxide layer is formed on a sidewall of the opening. The conductor is filled into the opening. The conductor is separated from the sidewall of the opening by only the oxide layer.

According to some embodiment, the method for manufacturing a semiconductor comprises the following steps. At first, a stack of alternate conductive layers and insulating layers is formed on a substrate. A plurality of openings is formed penetrating through the stack. An oxide layer is formed on sidewalls of the openings. Then, a conductor is filled into the openings. The conductor is separated from the sidewalls of the openings by only the oxide layer.

Figure 1A:
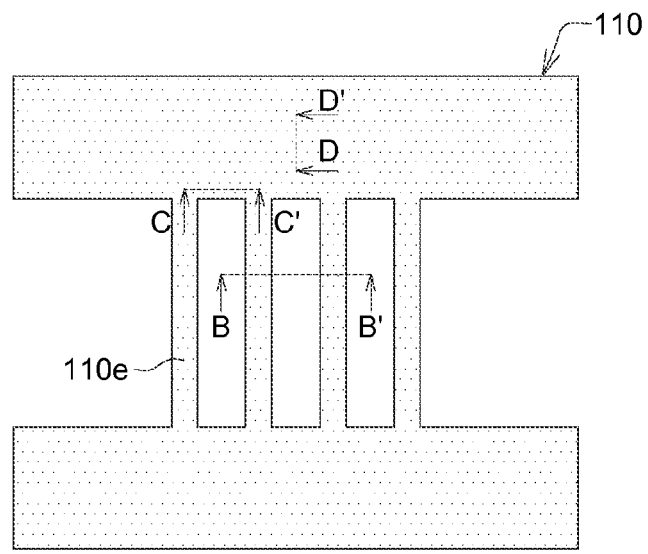
FIG. 1A-FIG. 9E schematically illustrate a method for manufacturing a semiconductor structure according to one embodiment of the present disclosure.
Figure 1B:
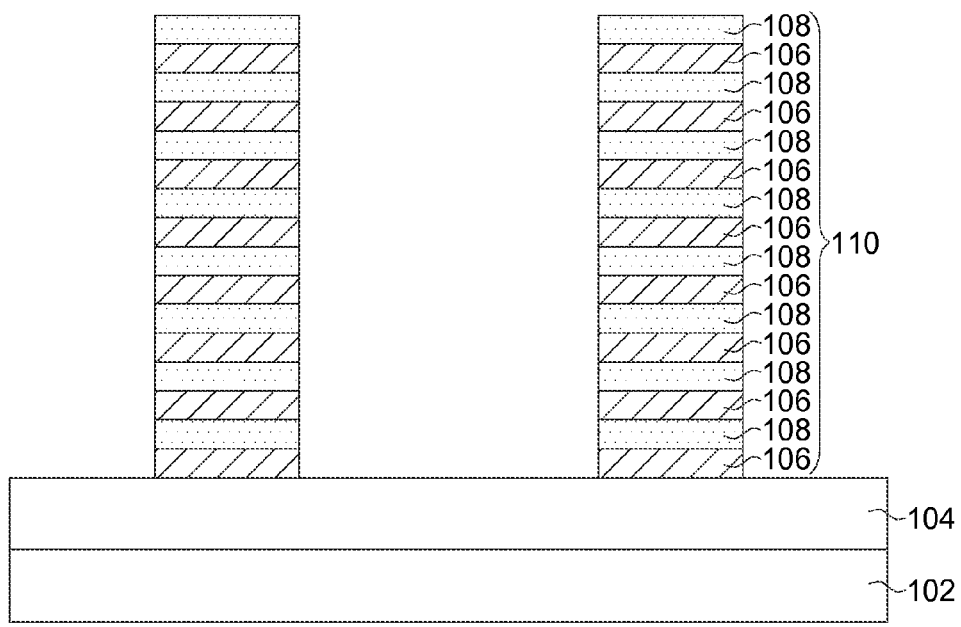
Figure 1C:
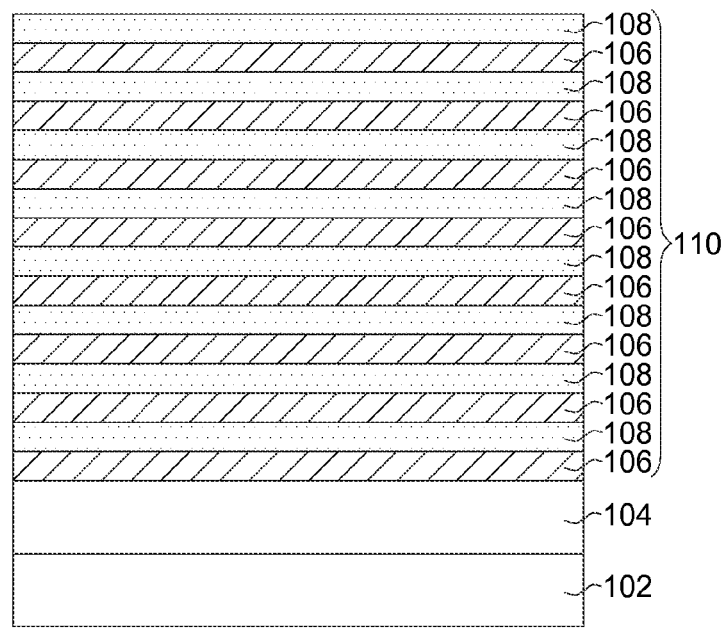
Figure 1D:
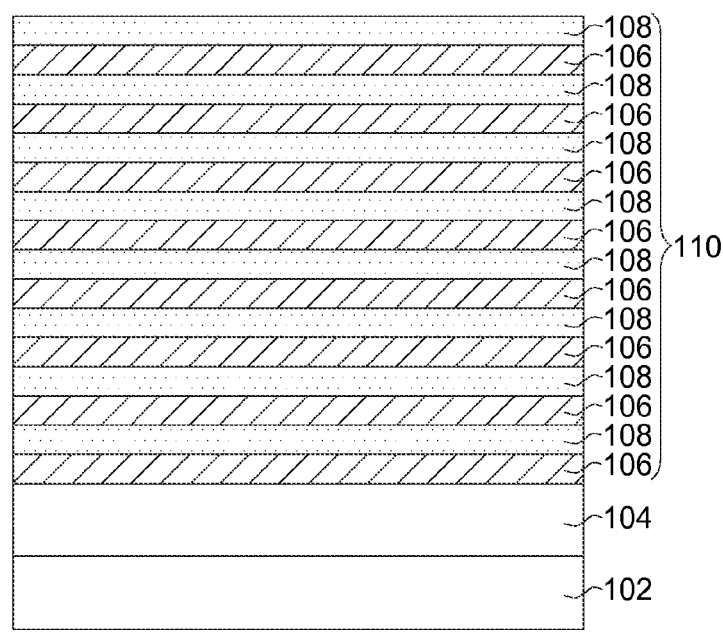
Figure 2A:
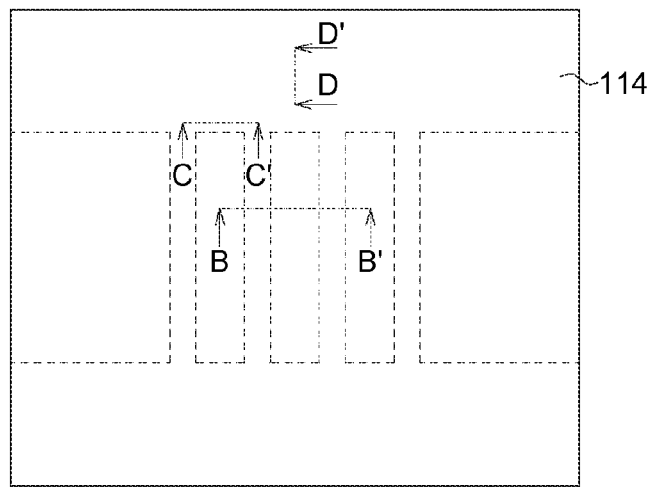
Figure 2B:
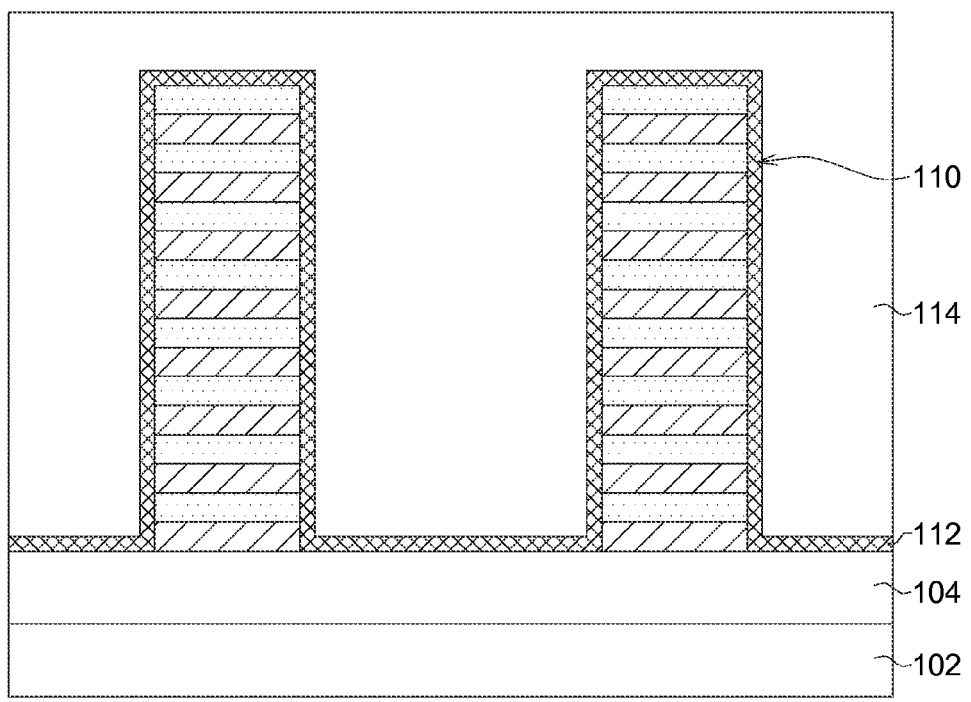
Figure 2C:
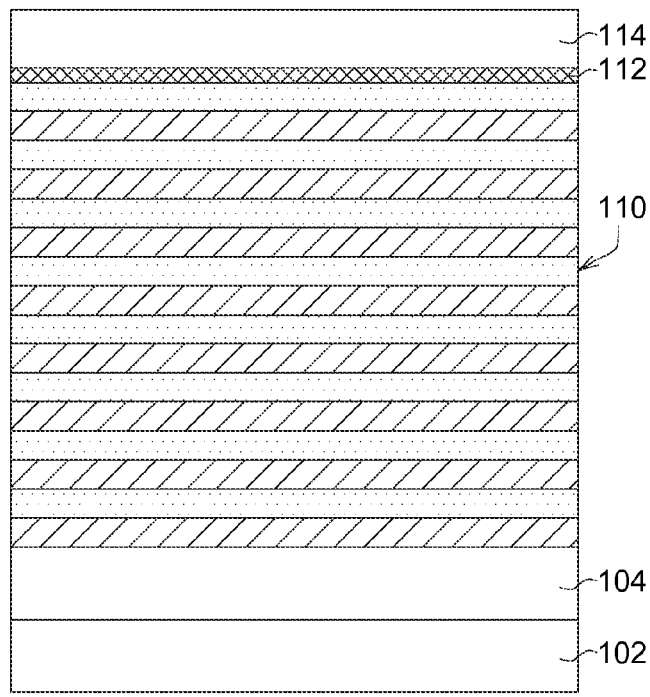
Figure 2D:
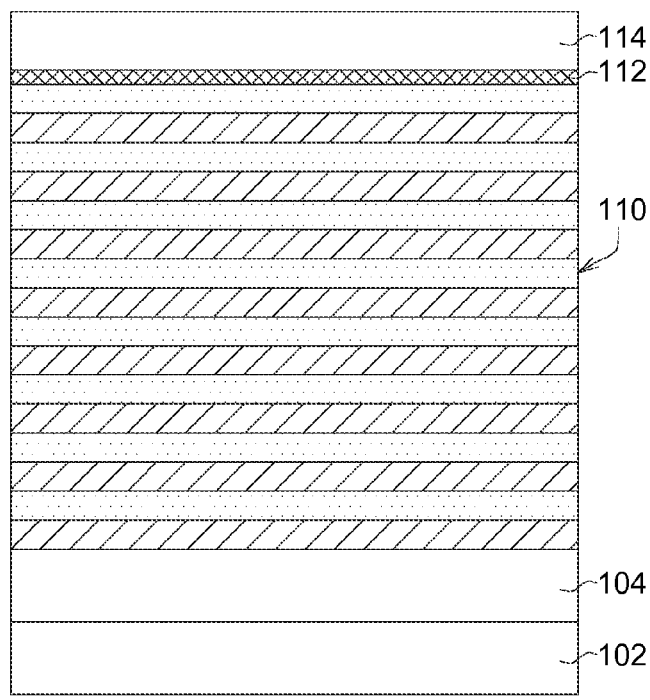
Figure 3A:
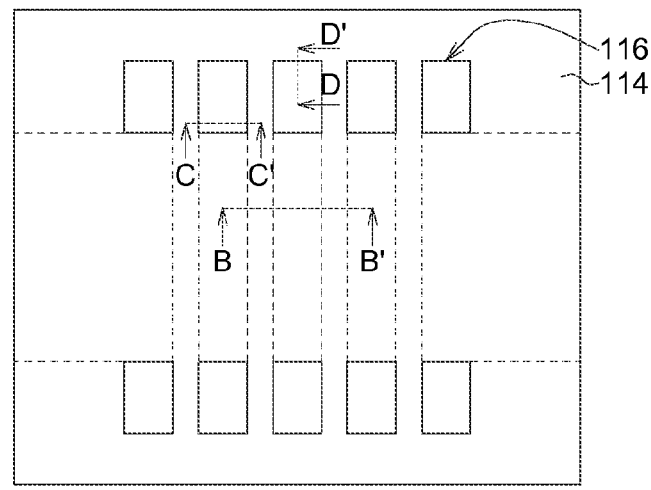
Figure 3B:
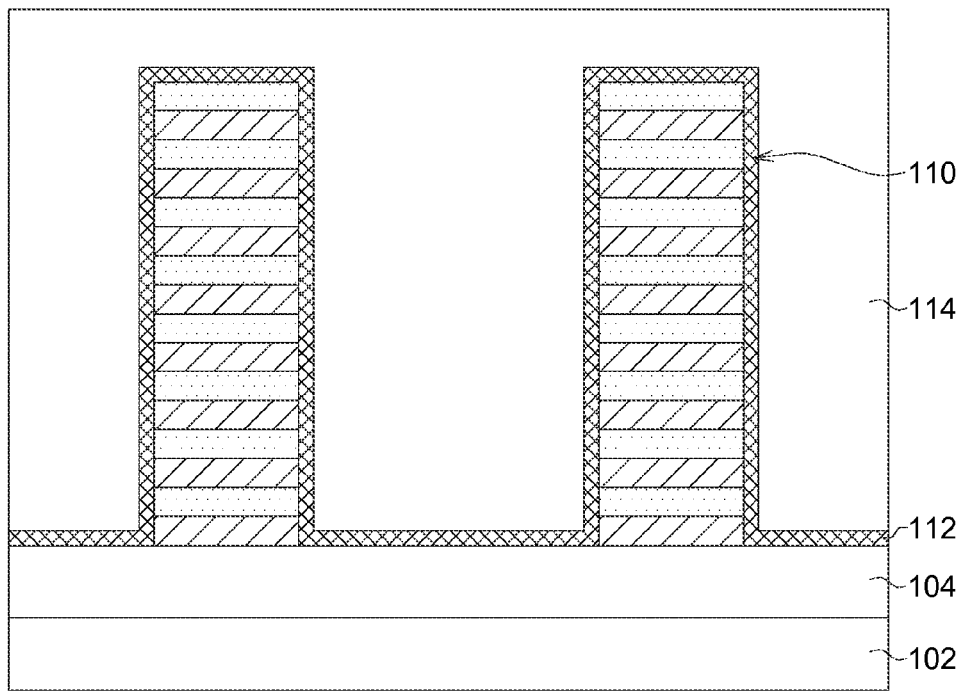
Figure 3C:
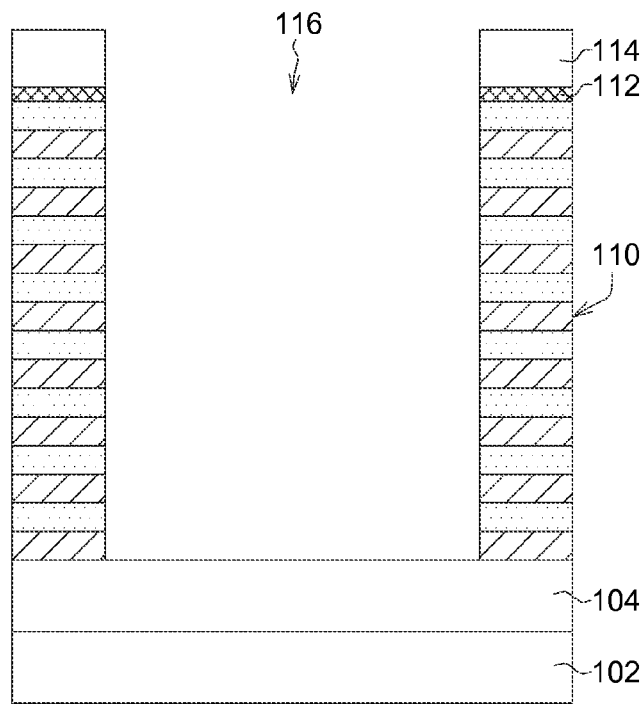
Figure 3D:
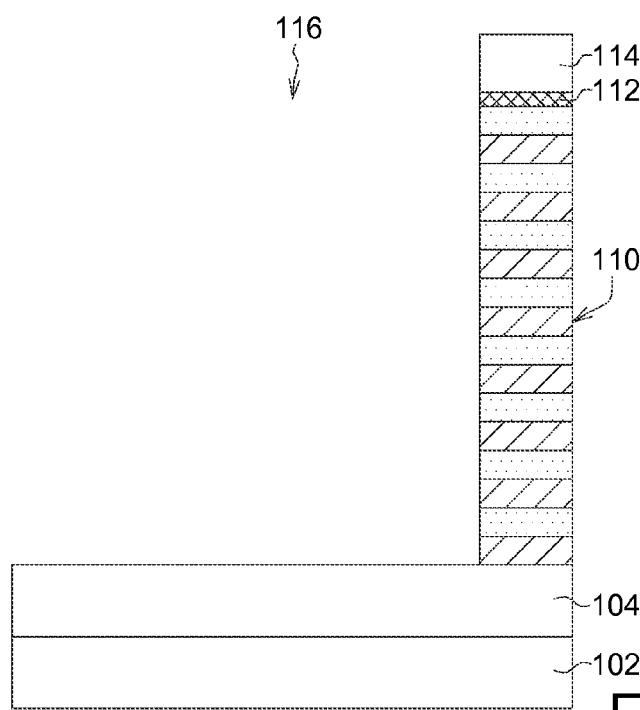
Figure 4A:
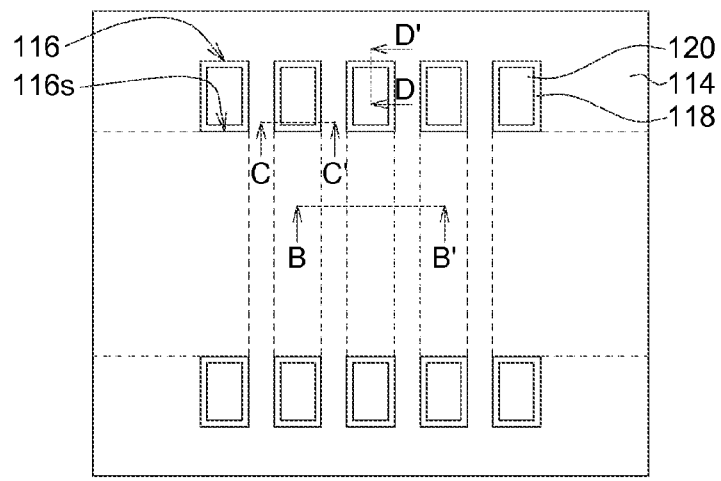
Figure 4B:
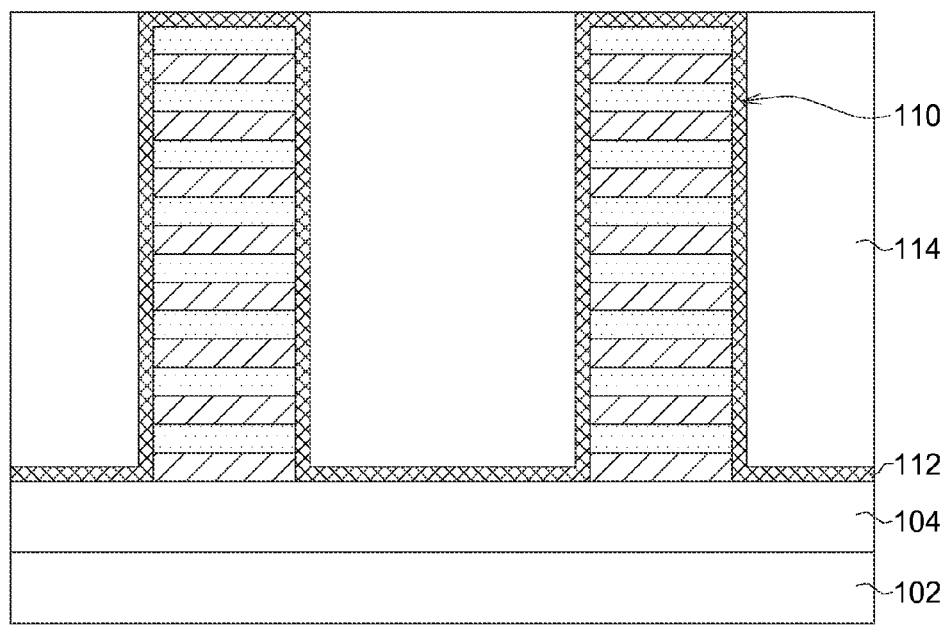
Figure 4C:
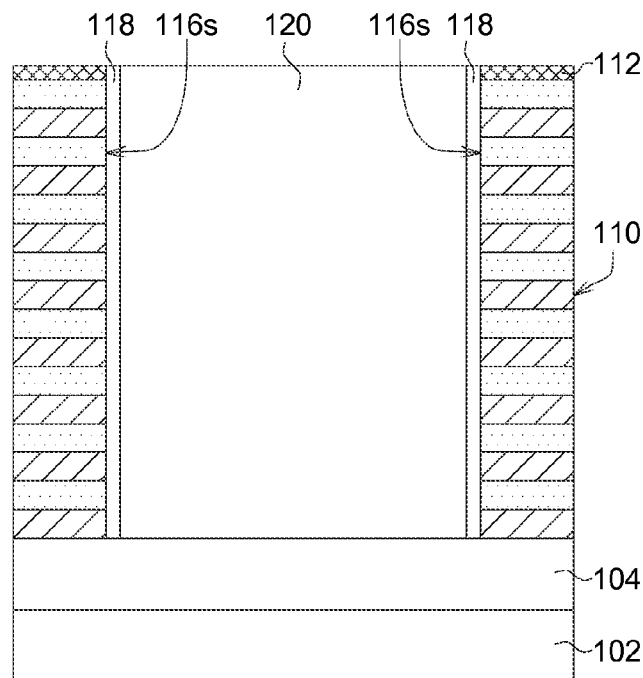
Figure 4D:
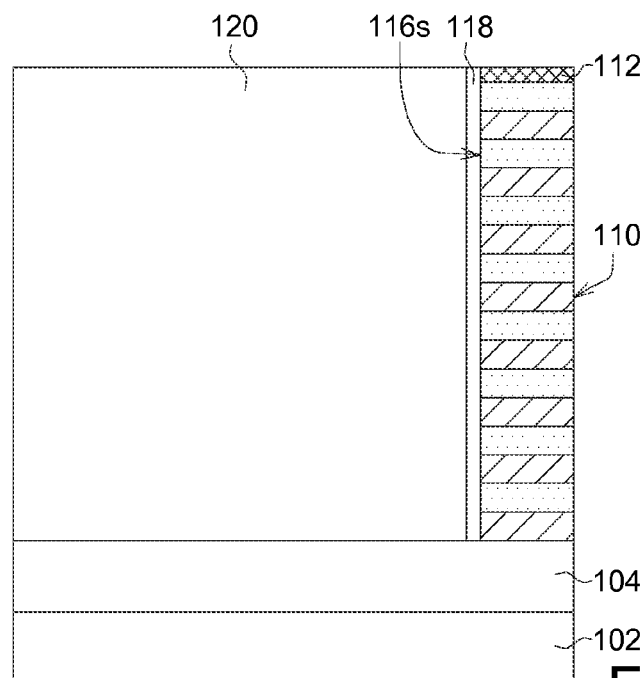
Figure 5A:
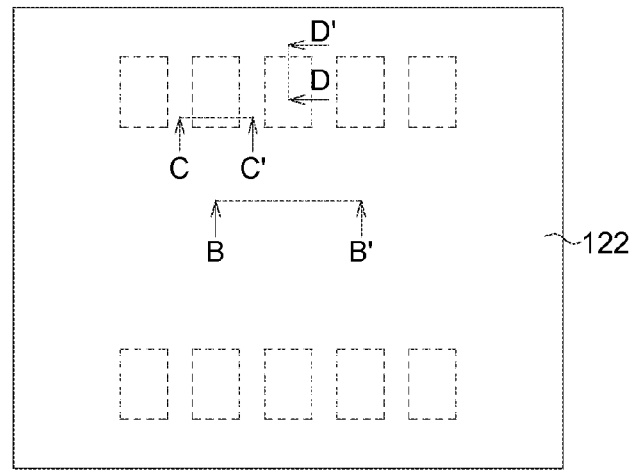
Figure 5B:
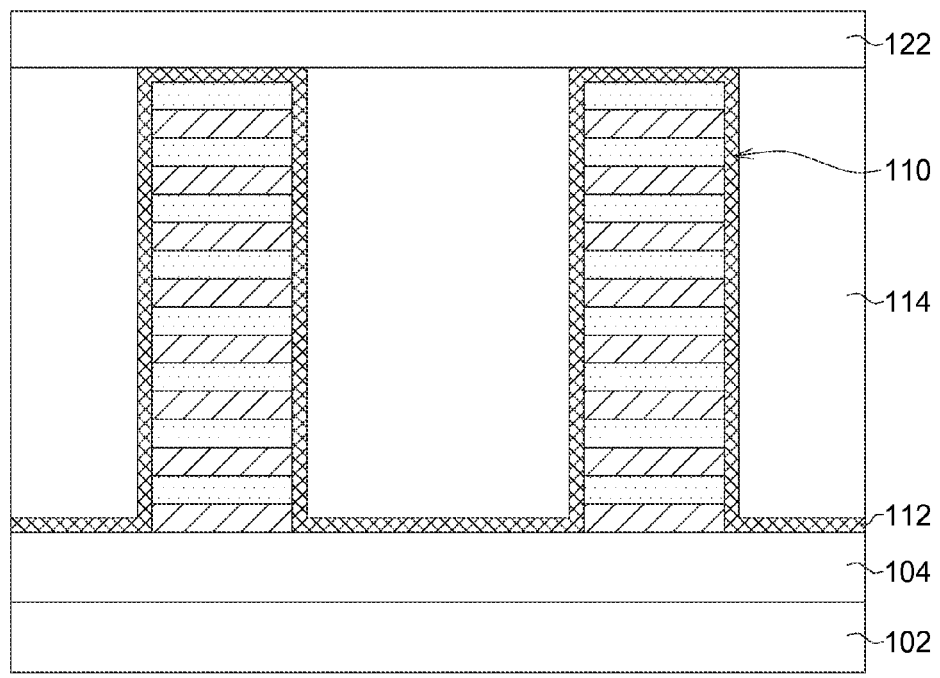
Figure 5C:
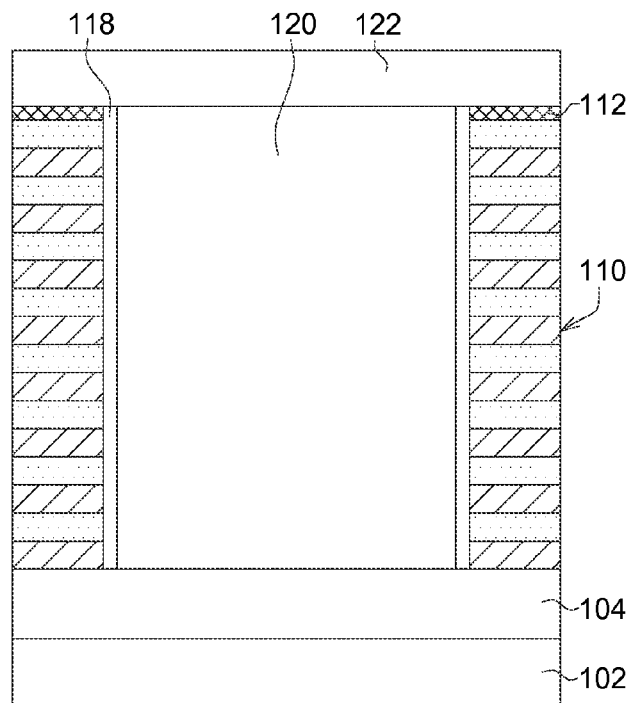
Figure 5D:
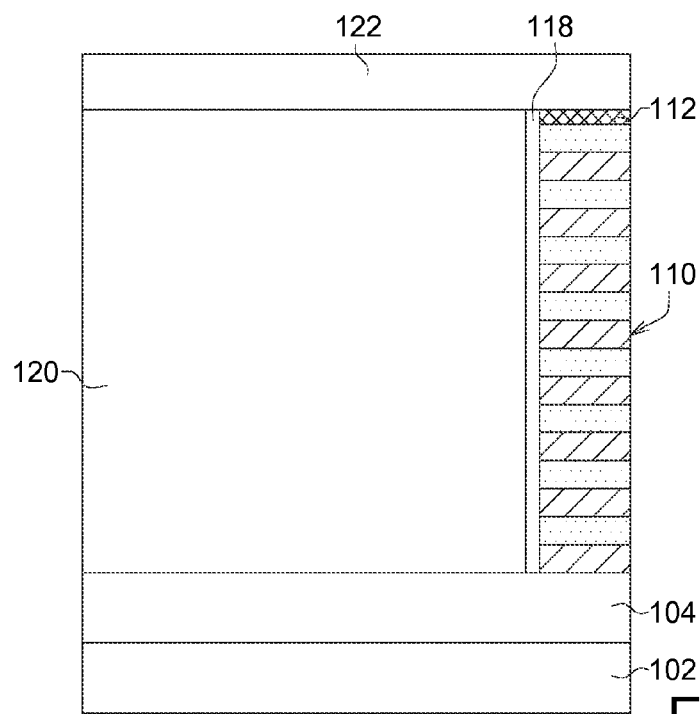

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to said semiconductor structure and the method for manufacturing the same. For purposes of explanation, the following embodiments will be exemplarily focused on a 3-D NAND memory device, such as a 3-D NAND vertical gate memory device. However, this invention is not limited thereto, for example, other semiconductor devices may have said semiconductor structure.

FIG. 1A-FIG. 9E schematically illustrate a method for manufacturing a semiconductor structure according to one embodiment of the present disclosure. The figures marked with "A" show top views of the structures. The figures marked with "B, "C", "D" and "E" show cross-sectional views taken from lines B-B', C-C', D-D' and E-E' in the top views of the structures, respectively.

Referring to FIG. 1A-FIG. 1D, a substrate 102 is provided with layers and/or devices optionally formed thereon. A bottom layer 104 may be formed on the substrate 102. The bottom layer 104 may be formed of oxides, and used as an etch stop layer in the following steps. A plurality of conductive layers 106 and a plurality of insulating layers 108 are formed on the bottom layer 104 alternately. The conductive layers 106 may be formed of poly-SI. The insulating layers 108 may be formed of oxides. The conductive layers 106 and the insulating layers 108 constitute a stack 110. The stack 110 may be patterned and thus comprise one or more extending portions 110e. The conductive layers 106 in the extending portions 110e may function as bit lines.

Referring to FIG. 2A-FIG. 2D, a tunneling layer-trapping layer-blocking layer structure 112 is formed conformally covering the stack 110. The tunneling layer-trapping layer-blocking layer structure 112 may be an oxide-nitride-oxide (ONO) structure, an oxide-nitride-oxide-nitride-oxide (ONONO) structure, or an oxide-nitride-oxide-nitride-oxide-nitride-oxide (ONONONO) structure. Then, a first conductive layer 114 is formed covering the tunneling layer-trapping layer-blocking layer structure 112. The first conductive layer 114 may be formed of heavily doped poly-Si, such as $p^+$-doped poly-Si. A planarization process may optionally be carried out such as by chemical mechanical planarization (CMP).

Referring to FIG. 3A-FIG. 3D, a plurality of openings 116 are formed. The openings 116 penetrate through the first conductive layer 114, the tunneling layer-trapping layer-blocking layer structure 112 and the stack 110. The openings 116 may be formed by an etching process, and no etching rate difference exists among the oxide, nitride, poly-Si forming the structure.

Referring to FIG. 4A-FIG. 4D, an oxide layer 118 is formed on sidewalls 116s of the openings 116. The oxide layer 118 may be formed by such as an oxidation process. A thickness of the oxide layer 118 may range from 20 Å to 100 Å, such as 70 Å. Then, a conductor 120 is filled into the openings 116. The conductor 120 is separated from the sidewalls 116s of the openings 116 by only the oxide layer 118. The conductor 120 may be formed of heavily doped poly-Si. The conductor 120 and the first conductive layer 114 may be formed of heavily doped poly-Si with the same or different doping types as needed. For example, the first conductive layer 114 may be formed of p$^+$-doped poly-Si, and the conductor 120 may be formed of n$^+$-doped poly-Si. An etching process for removing the unnecessary material for forming the conductor 120, and/or an etching process for removing the unnecessary material for forming the oxide layer 118, may optionally be carried out.

Referring to FIG. 5A-FIG. 5D, a second conductive layer 122 is formed connecting the conductor 120 with the first conductive layer 114. The second conductive layer 122 may be formed of poly-Si.

Figure 6A:
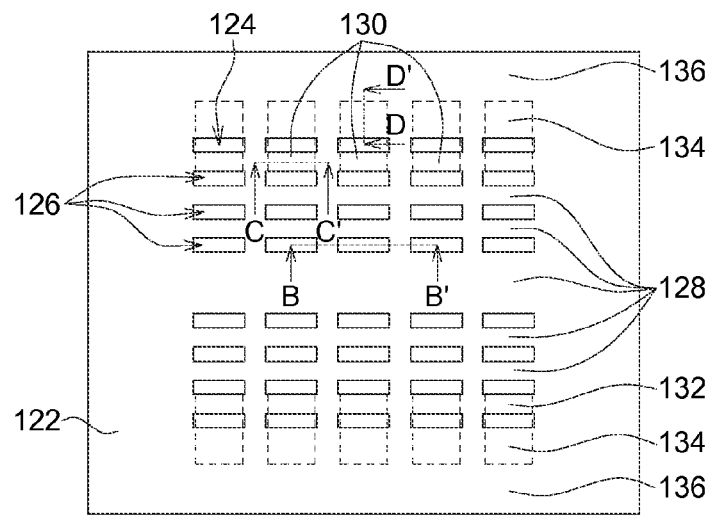
Figure 6B:
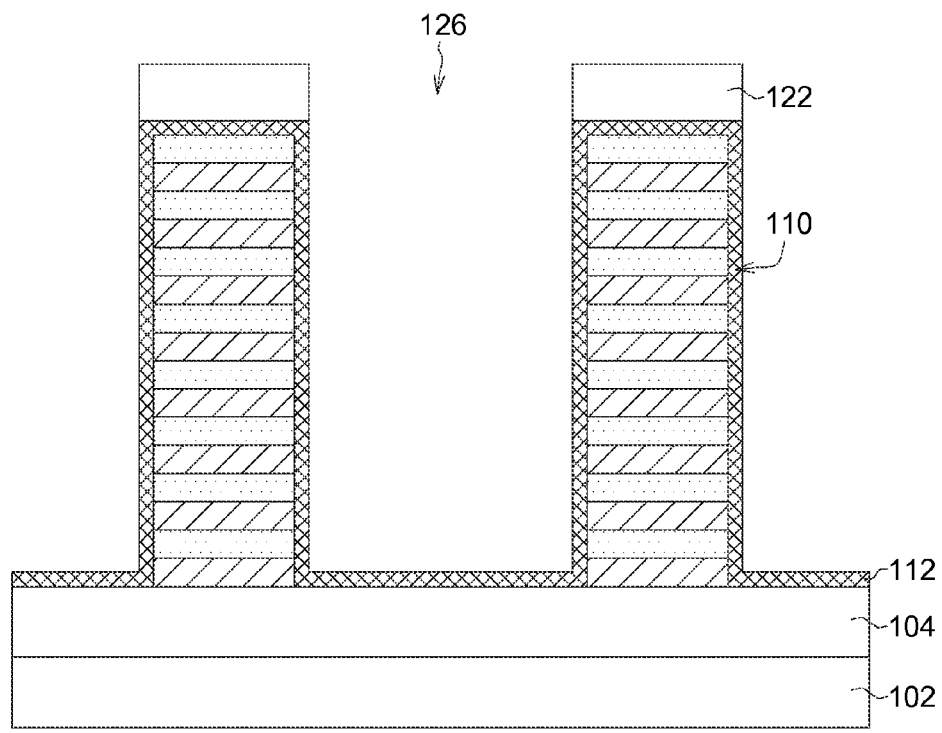
Figure 6C:
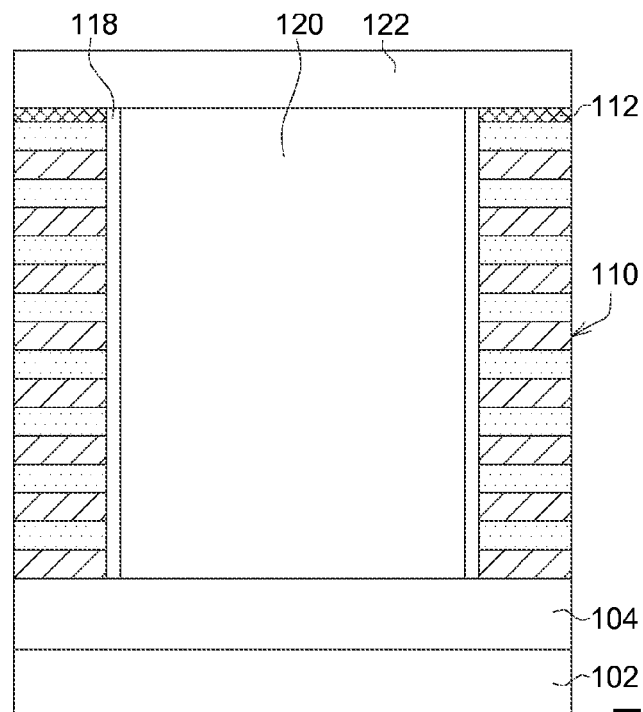
Figure 6D:
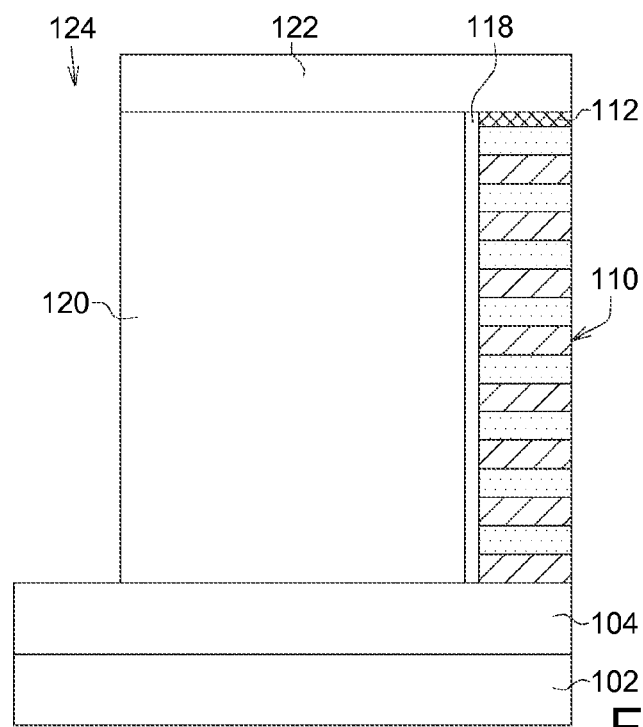
Figure 7A:
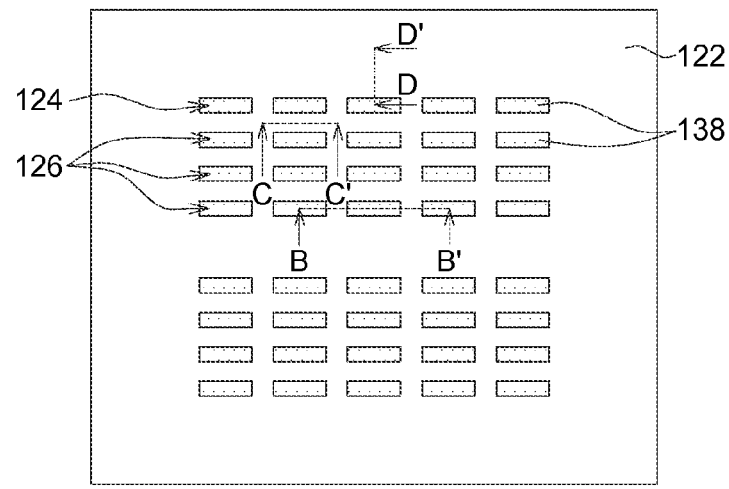
Figure 7B:
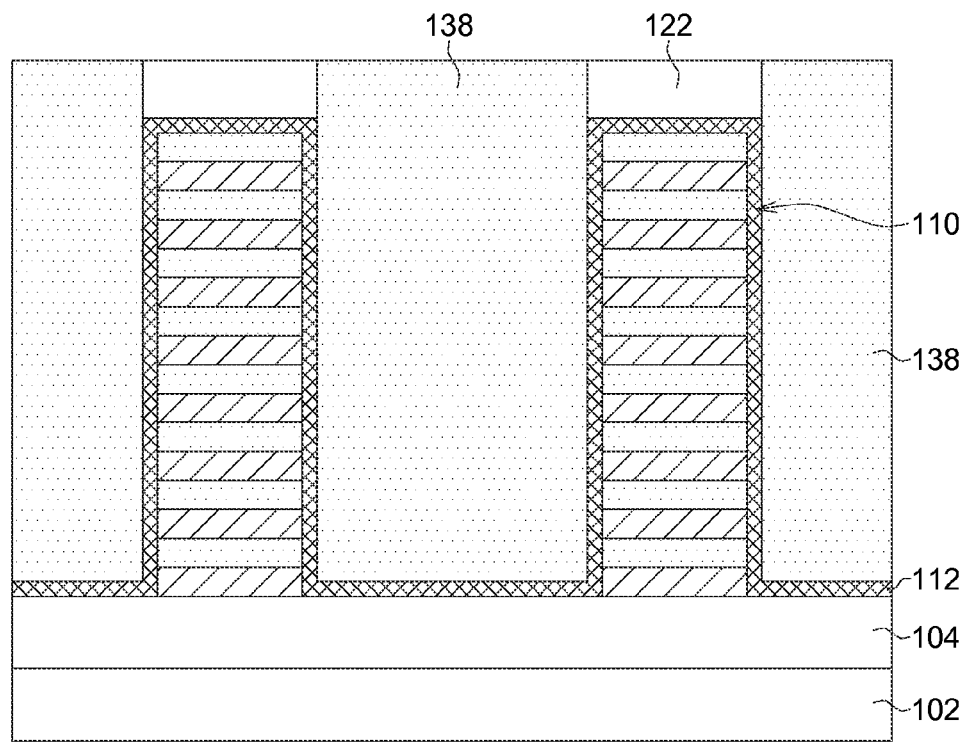
Figure 7C:
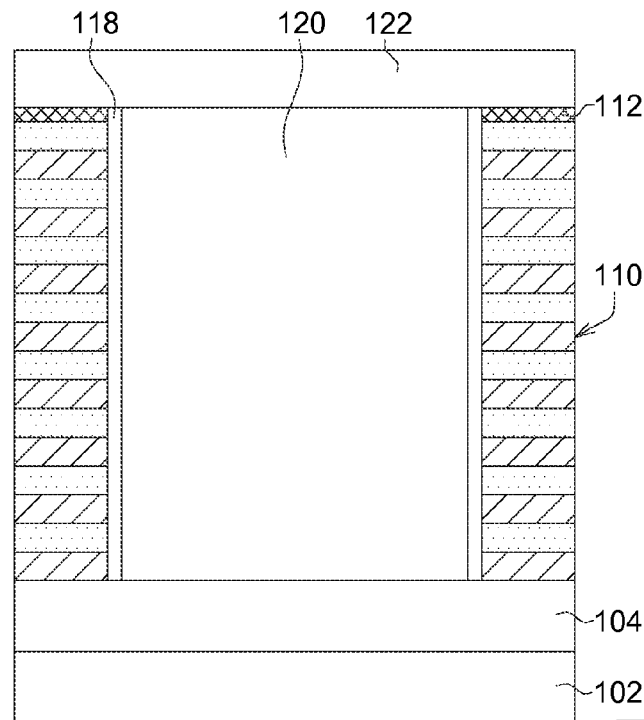
Figure 7D:
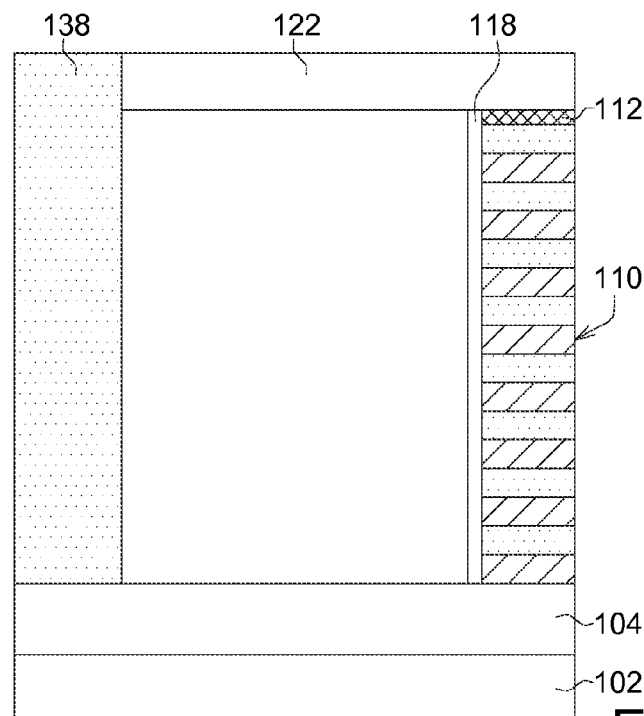
Figure 8A:
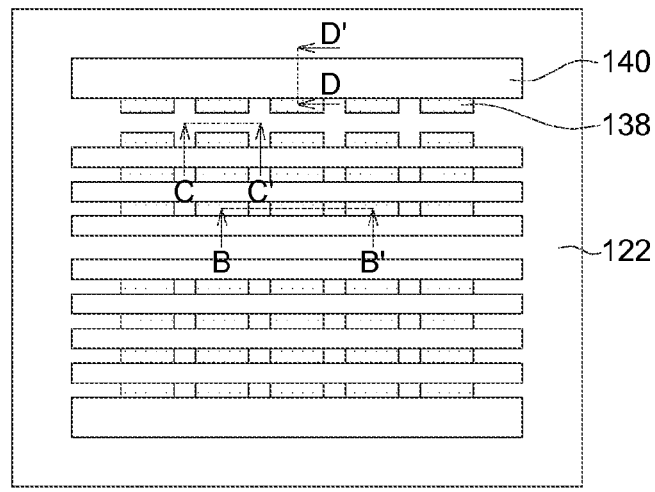
Figure 8B:
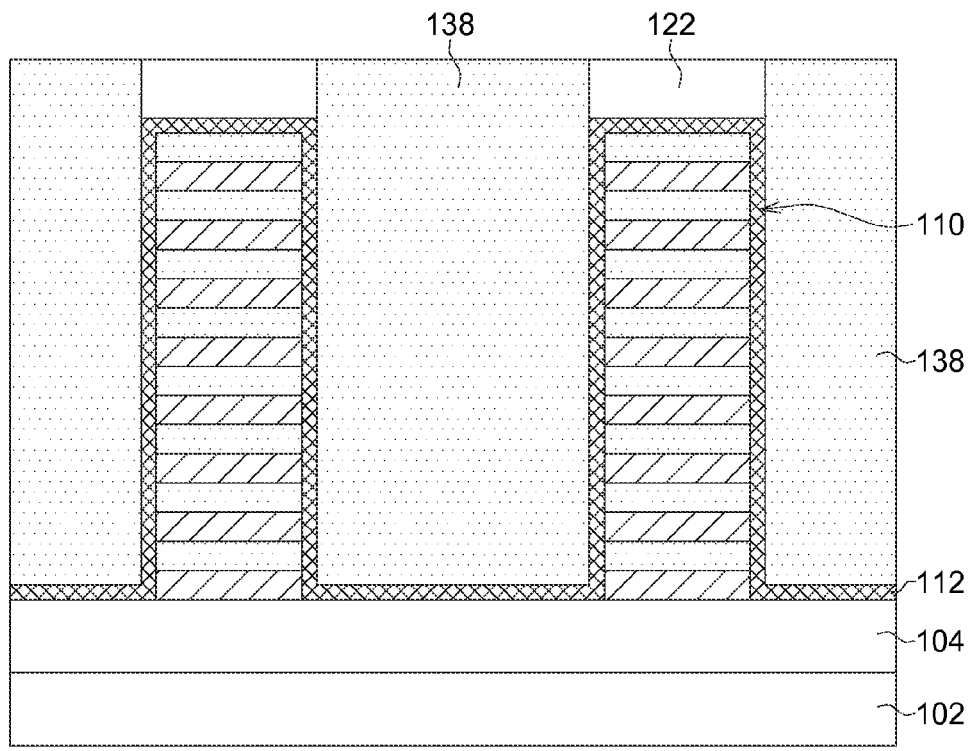
Figure 8C:
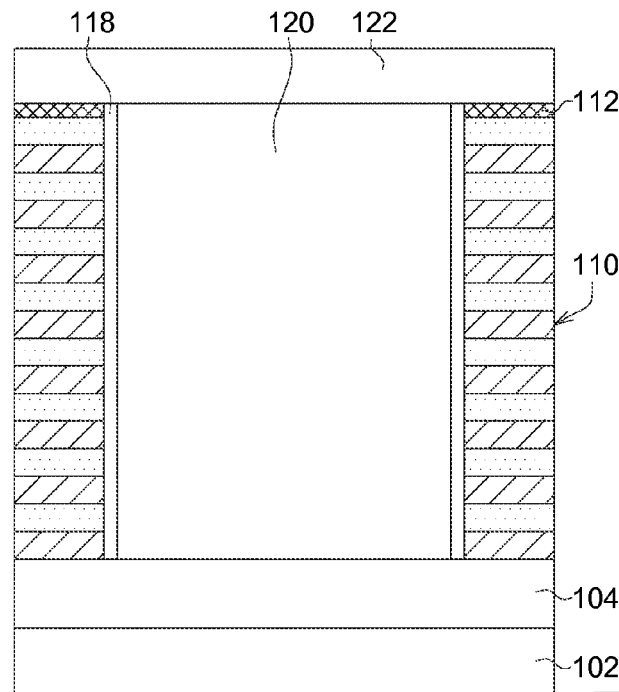
Figure 8D:
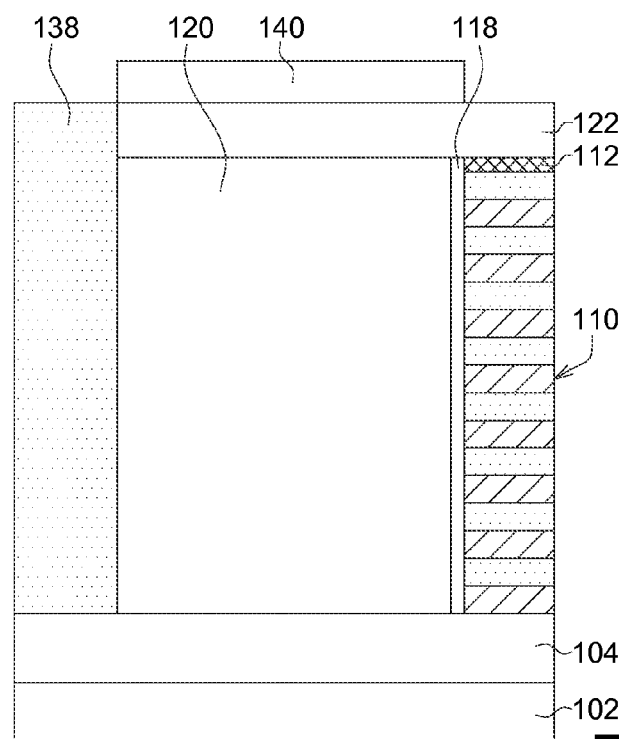
Figure 9A:
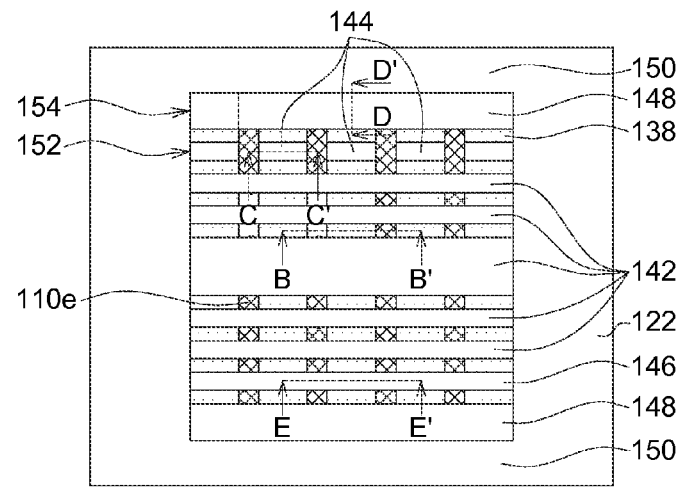
Figure 9B:
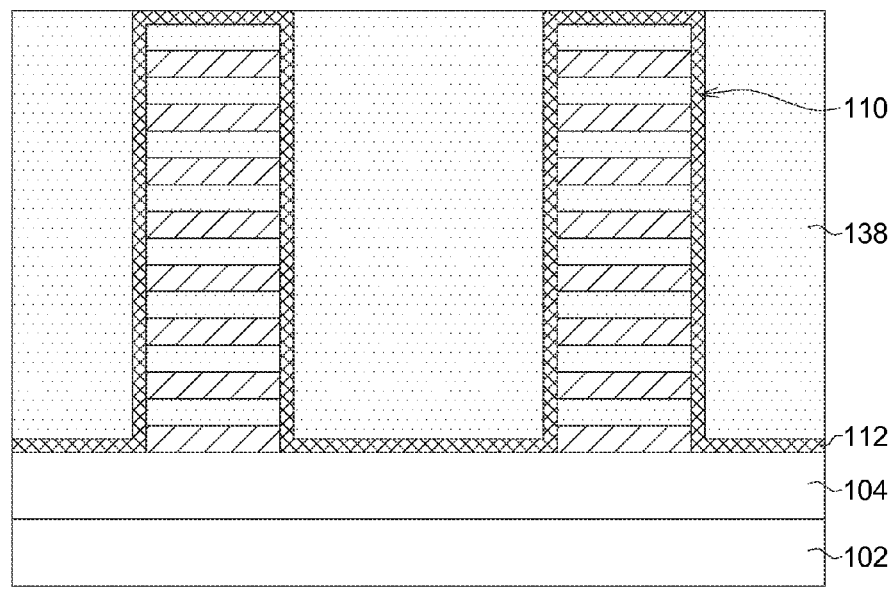
Figure 9C:
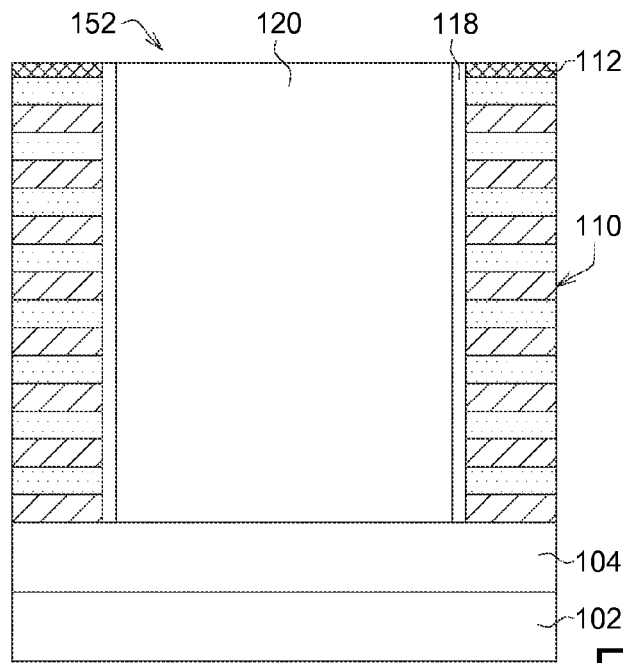
Figure 9D:
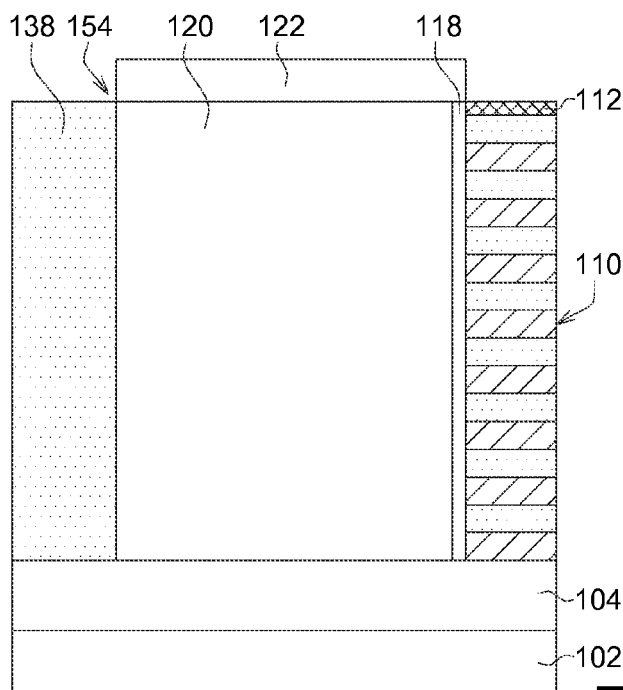
Figure 9E:
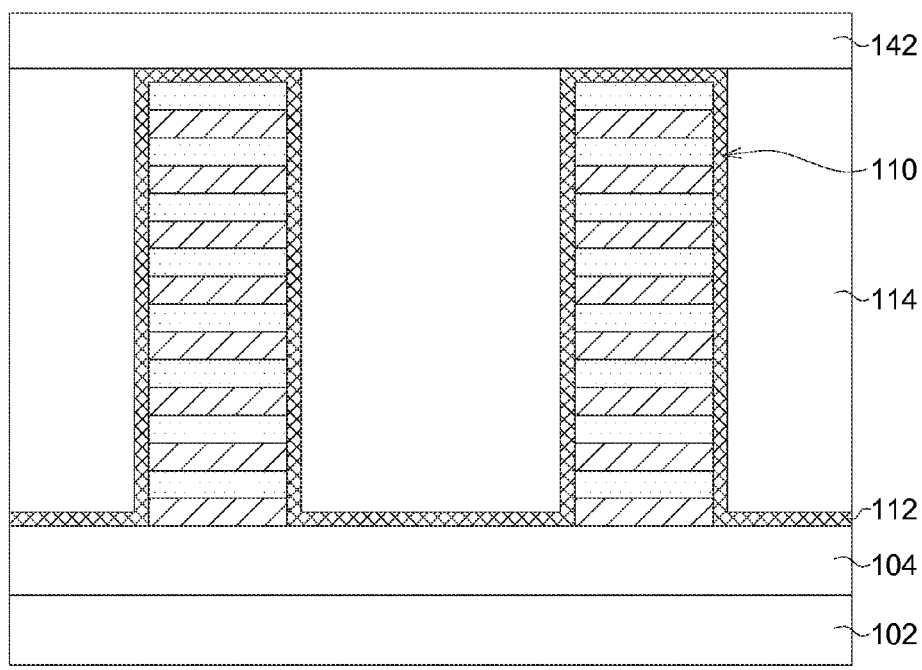

Referring to FIG. 6A-FIG. 6D, a plurality of first holes 124 are formed penetrating through the second conductive layer 122 and the conductor 120, and a plurality of second holes 126 are formed penetrating through the second conductive layer 122 and the first conductive layer 114. As such, positions 128 of a plurality of word lines are defined by the second holes 126. Positions 130 of a plurality of string select structure, positions 132 of a plurality of ground select structure, and positions 134 of a plurality of inversion gates, are defined by the first holes 124. Further, positions 136 of bit line pads are also defined. The first holes 124 and the second holes 126 may be formed by an etching process. Referring to FIG. 6B, the etching process may stop on the tunneling layer-trapping layer-blocking layer structure 112, or may etch through the tunneling layer-trapping layer-blocking layer structure 112 and stop on the bottom layer 104. Because of mis-alignment, the tunneling layer-trapping layer-blocking layer structure 112 on the sidewalls of the stack 110 may be partially etched or etched away, and in the latter case, the conductive layers 106 and the insulating layers 108 may be partially etched. The sizes of the second holes 126 may be the same as or different from the sizes of the first holes 124. In the case that the sizes of the first holes 124 and the second holes 126 are different, additional photolithography process, etching process, and insulator sealing process as described below are needed.

Referring to FIG. 7A-FIG. 7D, an insulator 138 is filled into the first holes 124 and the second holes 126, so as to seal the first holes 124 and the second holes 126. The insulator 138 may be formed of oxides.

Next, the string select structures, the ground select structures and the inversion gates are to be formed. Referring to FIG. 8A-FIG. 8D, photo resists 140 are formed over the structure for patterning. Referring to FIG. 9A-FIG. 9E, the word lines 142, the string select structures 144, the ground select structures 146 and the inversion gates 148 are formed at the same time. Each of the string select structures 144 comprises a part of the oxide layer 118 and a part of the conductor 120. Each of the ground select structures 146 comprises a part of the oxide layer 118 and a part of the conductor 120. Each of the inversion gates 148 comprises a part of the oxide layer 118 and a part of the conductor 120. Bit line pads 150 are positioned outside the inversion gates 148.

Here, since the gate oxide for the string select structure 144 and the ground select structure 146 is an oxide layer 118, which is different from the tunneling layer-trapping layer-blocking layer structure 112 used in the memory cells, an extra circuitry for controlling the program/erase of the gate oxide for the string select structure 144 and the ground select structure 146 is unneeded. Further, since the oxide layer 118 is only about 20 Å to 100 Å thick, much thinner than a tunneling layer-trapping layer-blocking layer structure 112 of which a thickness may be more than 200 Å, it is much easier to be controlled. Besides, the inversion gates 148 are used to turn on the circumference region of bit line pads 150, thus the layer-by-layer implantation process is unneeded. Further, since a thin oxide layer 118 is used, the resistance is decreased.

In one embodiment, as shown in FIG. 9A-FIG. 9E, a semiconductor structure manufactured by the method described above comprises a substrate 102, a stack 110 of alternate conductive layers 106 and insulating layers 108, a plurality of first openings 152, a plurality of second openings 154, an oxide layer 118 and a conductor 120. The stack 110 is formed on the substrate 102. The stack 110 may be patterned and thus comprise extending portions 110e. Each of the extending portions 110e extends from a portion of the stack 110 that is positioned between two of the first openings 152. The pair of one first opening 152 and one second opening 154 is parts of an opening 116 (shown in FIG. 3A). More specifically, the first openings 152 and the second openings 154 penetrate through the stack 110 and are separated from each other by an insulator 138 of the semiconductor structure. The oxide layer 118 is formed on sidewalls of the first openings 152 and the second openings 154. A thickness of the oxide layer 118 may range from 20 Å to 100 Å, such as 70 Å. The conductor 120 is filled into the first openings 152 and the second openings 154. The conductor 120 is separated from the sidewalls of the first openings 152 and the second openings 154 by only the oxide layer 118. The semiconductor structure may further comprise a tunneling layer-trapping layer-blocking layer structure 112 for memory cells. The tunneling layer-trapping layer-blocking layer structure 112 conformally covering the extending portions 110e. The tunneling layer-trapping layer-blocking layer structure 112 is an ONO structure, an ONONO structure or an ONONONO structure.

The conductor 120 filled into two of the first openings 152 may function as a string select structure 144. Alternatively, the conductor 120 filled into two of the first openings 152 may be connected with each other and function as a ground select structure 146. Since the gate oxide for the string select structure 144 and the ground select structure 146 is the oxide layer 118, which is different from the tunneling layer-trapping layer-blocking layer structure 112 used in the memory cells, an extra circuitry for controlling the program/erase of the gate oxide for the string select structure 144 and the ground select structure 146 is unneeded. Further, since the oxide layer 118 is only about 20 Å to 100 Å thick, much thinner than a tunneling layer-trapping layer-blocking layer structure 112, it is much easier to be controlled.

The conductor 120 filled into one of the second openings 154 may function as an inversion gate 148, and an inversion layer is created when an adequate voltage is applied to the inversion gate 148. Since the inversion gates 148 are used to turn on the circumference region of bit line pads 150, the layer-by-layer implantation process is unneeded. Further, since a thin oxide layer 118 is used, the resistance is decreased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A semiconductor structure, comprising:
   a substrate;
   a stack of alternate conductive layers and insulating layers formed on the substrate;

two openings penetrating through the stack, wherein the stack comprises an extending portion laterally extending from a portion of the stack that is positioned between the two openings and beyond the two openings;

an oxide layer formed on sidewalls of the two openings;

a conductor filled into the two openings, the conductor being separated from the sidewalls of the two openings by only the oxide layer, wherein the conductor filled into the two openings is for a string select structure or a ground select structure; and a tunneling layer-trapping layer-blocking layer structure conformally covering the extending portion of the stack, wherein a dielectric for the string select structure or the ground select structure is only the oxide layer and is non-overlapping with the tunneling layer-trapping layer-blocking layer structure for a memory cell.

2. The semiconductor structure according to claim 1, wherein a thickness of the oxide layer ranges from 20 Å to 100 Å.

3. The semiconductor structure according to claim 1, wherein the tunneling layer-trapping layer-blocking layer structure is an oxide-nitride-oxide (ONO) structure, an oxide-nitride-oxide-nitride-oxide (ONONO) structure, or an oxide-nitride-oxide-nitride-oxide-nitride-oxide (ONONONO) structure.

4. A semiconductor structure, comprising:
a substrate;
a stack of alternate conductive layers and insulating layers formed on the substrate;
an opening penetrating through the stack, wherein the stack comprises an extending portion laterally extending from a portion of the stack that is positioned adjacent the opening and beyond the opening;

an oxide layer formed on a sidewall of the opening;

a conductor filled into the opening, the conductor being separated from the sidewall of the opening by only the oxide layer, wherein the conductor filled into the opening is for a string select structure or a ground select structure; and a tunneling layer-trapping layer-blocking layer structure conformally covering the extending portion of the stack, wherein a dielectric for the string select structure or the ground select structure is only the oxide layer and is non-overlapping with the tunneling layer-trapping layer-blocking layer structure for a memory cell.

5. The semiconductor structure according to claim 4, wherein a thickness of the oxide layer ranges from 20 Å to 100 Å.

6. The semiconductor structure according to claim 4, wherein the conductor filled into the opening functions as an inversion gate, and an inversion layer is created by applying a voltage to the inversion gate.

7. The semiconductor structure according to claim 4, wherein the tunneling layer-trapping layer-blocking layer structure is an oxide-nitride-oxide (ONO) structure, an oxide-nitride-oxide-nitride-oxide (ONONO) structure, or an oxide-nitride-oxide-nitride-oxide-nitride-oxide (ONONONO) structure.

* * * * *